United States Patent
Tillotson et al.

[11] Patent Number: 6,162,364
[45] Date of Patent: Dec. 19, 2000

[54] METHOD FOR MANIPULATION OF DIAMAGNETIC OBJECTS IN A LOW GRAVITY ENVIRONMENT

[75] Inventors: Brian J. Tillotson, Kent; Larry P. Torre, Bellevue, both of Wash.; Janice D. Houston, Huntsville, Ala.

[73] Assignee: The Boeing Company, Seattle, Wash.

[21] Appl. No.: 09/097,896

[22] Filed: Jun. 16, 1998

Related U.S. Application Data

[60] Provisional application No. 60/070,603, Jan. 6, 1998.

[51] Int. Cl.$^7$ ........................................................ B03C 1/00
[52] U.S. Cl. .............................. 210/695; 210/748; 95/28; 148/103; 204/557; 209/212
[58] Field of Search ..................................... 210/222, 223, 210/695, 748; 204/155, 557, 554, 660, 664; 209/212; 95/28; 148/100, 103, 108

[56] References Cited

U.S. PATENT DOCUMENTS

| | | | |
|---|---|---|---|
| 4,027,494 | 6/1977 | Flethcer et al. | 210/222 |
| 4,508,615 | 4/1985 | Graham | 210/695 |
| 5,238,547 | 8/1993 | Tsubouchi et al. | 210/222 |
| 5,366,566 | 11/1994 | Tournier | 148/103 |

OTHER PUBLICATIONS

Brian Tilloston and J. Houston, Diamagnetic Manipulation for Microgravity Processing, pp. 1–10, 1996.

*Primary Examiner*—David A. Reifsnyder
*Attorney, Agent, or Firm*—Christensen O'Connor Johnson Kindness PLLC

[57] ABSTRACT

A method and system for diamagnetic manipulation of an object in a surrounding medium in a low gravity environment is provided. The system can be used in various applications such as containerless materials processing, protein crystal growth, and particulate filtering. If the application requires directional manipulation of the object, at least one magnet or electromagnet is required. The object is repulsed by the magnet if the object is more strongly diamagnetic than the surrounding medium. If the object is less diamagnetic than the surrounding medium, however, then the object is effectively attracted to the magnet. For an application that requires suspension of the object, two oppositely polarized magnets are used to generate an appropriate magnetic field gradient to suspend the object in a location where opposing field vectors generated by the two magnets cancel each other out, producing a net field strength of zero.

14 Claims, 2 Drawing Sheets

METHOD FOR MANIPULATION OF DIAMAGNETIC OBJECTS IN A LOW GRAVITY ENVIRONMENT

CROSS-REFERENCE TO RELATED APPLICATION

The present application claims the benefit of U.S. Provisional Patent Application Serial No. 60/070,603, filed Jan. 6, 1998.

FIELD OF THE INVENTION

The present invention relates generally to non-contact manipulation of objects in a low gravity environment and, more particularly, to magnetic manipulation of objects in such an environment.

BACKGROUND OF THE INVENTION

In some circumstances, it is desirable to manipulate an object without using any direct mechanical contact because direct mechanical contact may cause contamination of or damage to the object being manipulated or of objects that the manipulated object contacts. Some situations in which direct mechanical contact is not desirable include protein crystal growth, containerless materials processing and particulate filtering. Such situations are especially common in applications which exploit gravity levels that are substantially weaker than Earth's surface gravity.

While magnetic manipulation has been attempted, its application has been limited. One prior magnetic manipulation method is limited to manipulation of microscopic objects. This method requires coating the object with materials containing paramagnetic salts, that is, materials that make the object more strongly magnetic. These coatings are unacceptable in applications striving for high purity in the object to be manipulated. Another prior method requires that the medium surrounding the object be a paramagnetic fluid. Yet another method requires that the object be immersed in a ferrofluid. Still another method requires that the object be made of an electrically conducting substance. Another method requires the use of a special superconducting coil and associated apparatus. This method is costly and constrains the object to a size smaller than the bore of the superconducting coil. Still another method is limited to a particular material, namely pyrolytic graphite, which has a high magnetic susceptibility and is anisotropic.

Accordingly, it is an object of this invention to provide a method and system for diamagnetic manipulation that applies to both macroscopic and microscopic objects.

It is another object of this invention to provide a method and system for diamagnetic manipulation that does not require introducing impurities into the object being manipulated.

It is another object of this invention to provide a method and system for diamagnetic manipulation that does not require the surrounding medium to be a fluid. Additionally, if the surrounding medium is a fluid, the present invention does not require that the fluid be paramagnetic or a ferrofluid.

It is another object of this invention to provide a method and system for diamagnetic manipulation that does not limit application to electrically conductive objects.

It is another object of this invention to provide a method and system for diamagnetic manipulation that does not require the object to fit within the bore of a special superconducting coil.

It is another object of this invention to provide a method and system for diamagnetic manipulation that does not limit application to highly magnetically susceptible objects.

It is another object of this invention to provide a method and system for diamagnetic manipulation that applies to both isotropic and anisotropic objects, thereby eliminating the need to match the magnetic field orientation to the anisotropic nature of the object.

SUMMARY OF THE INVENTION

Most materials intrinsically exhibit diamagnetic behavior at the macroscopic scale. That is, objects composed of the diamagnetic material are repulsed by a magnetic field. The diamagnetic repulsive force is relatively weak and is normally masked by the stronger, attractive forces of Earth's gravity. Thus, under the influence of Earth's gravitational force, the repulsive force of diamagnetism is not sufficiently strong to repulse the object unless specially designed superconducting electromagnets are used. Stated in another way, for diamagnetic materials the force exerted by a typical magnet is so weak that it is insignificant compared to Earth's gravity and gravity-induced friction. However, magnetic force on a diamagnetic object can be the dominant force in a microgravity or low gravity environment. This makes diamagnetism useful for applications described herein. For example, in a low gravity environment, the repulsive force of diamagnetism is sufficiently strong to repulse an object using conventional magnets. Examples of diamagnetic materials include water, biological tissues, plastics, glasses, most ceramics, many metals and organic materials such as wood, cotton and proteins. The degree to which these materials are repulsed by diamagnetism is determined by several factors including the number of electrons per atom, the electron orbital radius, and the strength of the applied magnetic field.

A system for diamagnetic manipulation of an object in a surrounding medium in a low gravity environment requires one or more permanent magnets or electromagnets of suitable strength, depending on the application and materials involved. The magnet or magnets are positioned in such a way as to generate a desired magnetic field configuration for controlling the spatial location of the object within a working volume, i.e., the three-dimensional region of space in which the object is manipulated.

Although the working volume may be bounded solely by the magnetic fields, it is preferable that the working volume also be surrounded by a container. The container prevents loss of the object in case of failure of the magnetic field to confine the object, prevents contamination of the object and holds the object prior to and after manipulation. The container normally includes an access door or hatch for placing the object in the container and removing the object from the container.

The object in the working volume may be surrounded by a vacuum, or by a medium such as a gas or a fluid. For example, the surrounding medium may be a protein crystal growth solution, air, water, organic or inorganic solution, solvent or inert gas. The fluid used, if any, depends on the application and materials involved.

Immersed in an appropriate medium and subject to an appropriate magnetic field gradient, the object may be manipulated by a diamagnetic force that is dependent on the magnitude of the diamagnetic susceptibility of the object and the applied magnetic field. For example, if the application requires that the object move laterally back and forth in the container, an electromagnet is positioned on each of the two opposing sides of the container. The two electromagnets are alternatingly turned on and off. If the object is more diamagnetic than the surrounding medium, then the object will move away from the electromagnet that is on and towards the electromagnet that is off due to the repulsive force of diamagnetism. Conversely, if the object is less diamagnetic than the surrounding medium, then the object will, in effect, move toward the electromagnet that is on and away from the electromagnet that is off because the electromagnet that is on repels the surrounding medium more strongly than it repels the object.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENTS

Diamagnetism differs in significant ways from previous microgravity manipulation methods, and therefore is suitable for a different set of applications. Unlike electromagnetic manipulation, use of magnetic force on a diamagnetic material does not require the material to be electrically conductive, so applications can use a wider range of materials. Unlike electrostatic manipulation, diamagnetism does not require the manipulated object to be electrically charged, so the object can be immersed in an electrically conductive medium. Unlike acoustic manipulation, diamagnetism does not require the object to be in a fluid medium so the object can be manipulated in a vacuum. A difference between diamagnetism and most other methods is that the magnetic force acts throughout the body of the object, while most other methods act on or near the surface. Acoustic manipulation uses surface forces which occur at the interface between the object and the surrounding medium. Electrostatic manipulation of electrical conductors also uses surface forces in the electric charge on a conductive object remains on its surface. Electromagnetic manipulation uses a body force, but one which acts only on the parts of the object in which the electric currents are induced, e.g., the equatorial region of a spherical specimen. The ability of diamagnetism to act uniformly throughout a body may be useful for manipulating very fragile objects which lack the structural strength needed to transmit manipulation forces from one part of the object to another.

Figure 1A:
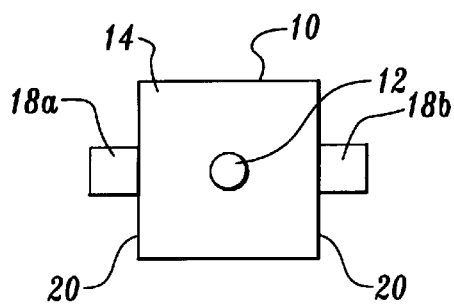
FIG. 1A is a schematic diagram of an actual embodiment of a system for suspending a diamagnetic object in a container using two magnets in a low gravity environment.

Referring to FIG. 1A, in a preferred embodiment, a system for suspending an object 12 in a low gravity environment is schematically illustrated. Suspension of the object 12 is desirable in some applications such as containerless materials processing and protein crystal growth. The system includes a container 10 for holding the object 12 to be manipulated. The container 10 may be made of any of a variety of materials that are nonferromagnetic and non-superconducting such as glass, plastic, thermoplastics, and stainless steel. Preferably, at least one side of the container 10 is made of a suitable transparent material, such as quartz, glass, or plastic (e.g., Lexan) to enable viewing of the object 12 in the container 10. The container 10 may include an access door or hatch (not shown) for the insertion of the object 12 into the container 10 and removal of the object from the container.

The object 12 to be manipulated in the container 10 is preferably composed of material that is diamagnetic at working temperatures. That is, the object 12 should be composed of a diamagnetic material, which by definition has a negative magnetic susceptibility, in contrast to paramagnetic, ferromagnetic, ferrimagnetic and antiferromagnetic materials that have positive magnetic susceptibilities. Examples of suitable diamagnetic materials include bismuth; gold; lead; mercury; some ceramics; organic materials such as wood, cotton and proteins; biological tissues; glass; organic and inorganic liquids such as water, ethanol, and acetone.

The object 12 is immersed in a surrounding medium 14 that either does not exhibit diamagnetic behavior or has a diamagnetic susceptibility different from the diamagnetic susceptibility of the object 12. Alternatively, the container 10 may be evacuated to eliminate the influence of an immersion medium. The surrounding medium 14 may be a fluid or a gas, depending on the application. For example, the surrounding medium 14 may be a protein growth solution if the object 12 to be suspended is a growing protein crystal. The surrounding medium 14 may also be, but is not limited to, air, water, organic or inorganic solution, solvent, and inert gas.

The system includes two permanent magnets 18a and 18b, preferably positioned externally to the container 10 to avoid possible contamination. The two magnets 18a and 18b used are preferably conventional permanent magnets, such as samarium cobalt and neodymium-iron-boron magnets, that have a magnetic field strength of at least ¼ T. The magnet or magnets are held in place by any of various types of holding devices (not shown). The location of the magnet or magnets 18a and 18b is dependent on the desired magnetic field strength and configuration.

Figure 1B:
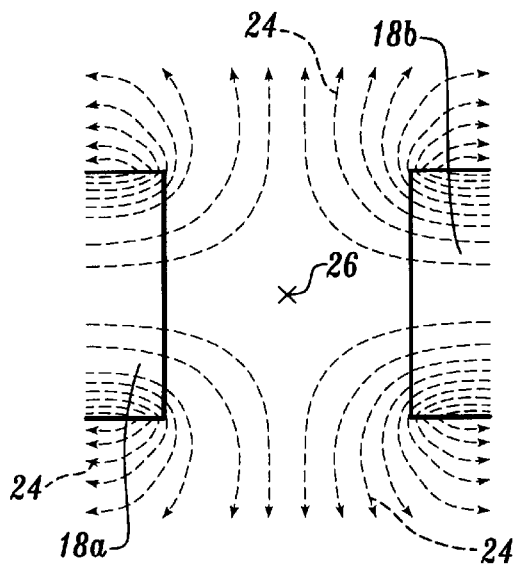
FIG. 1B is a diagram of the magnetic field lines generated by the two magnets in the system schematically illustrated in FIG. 1A.
Figure 1C:
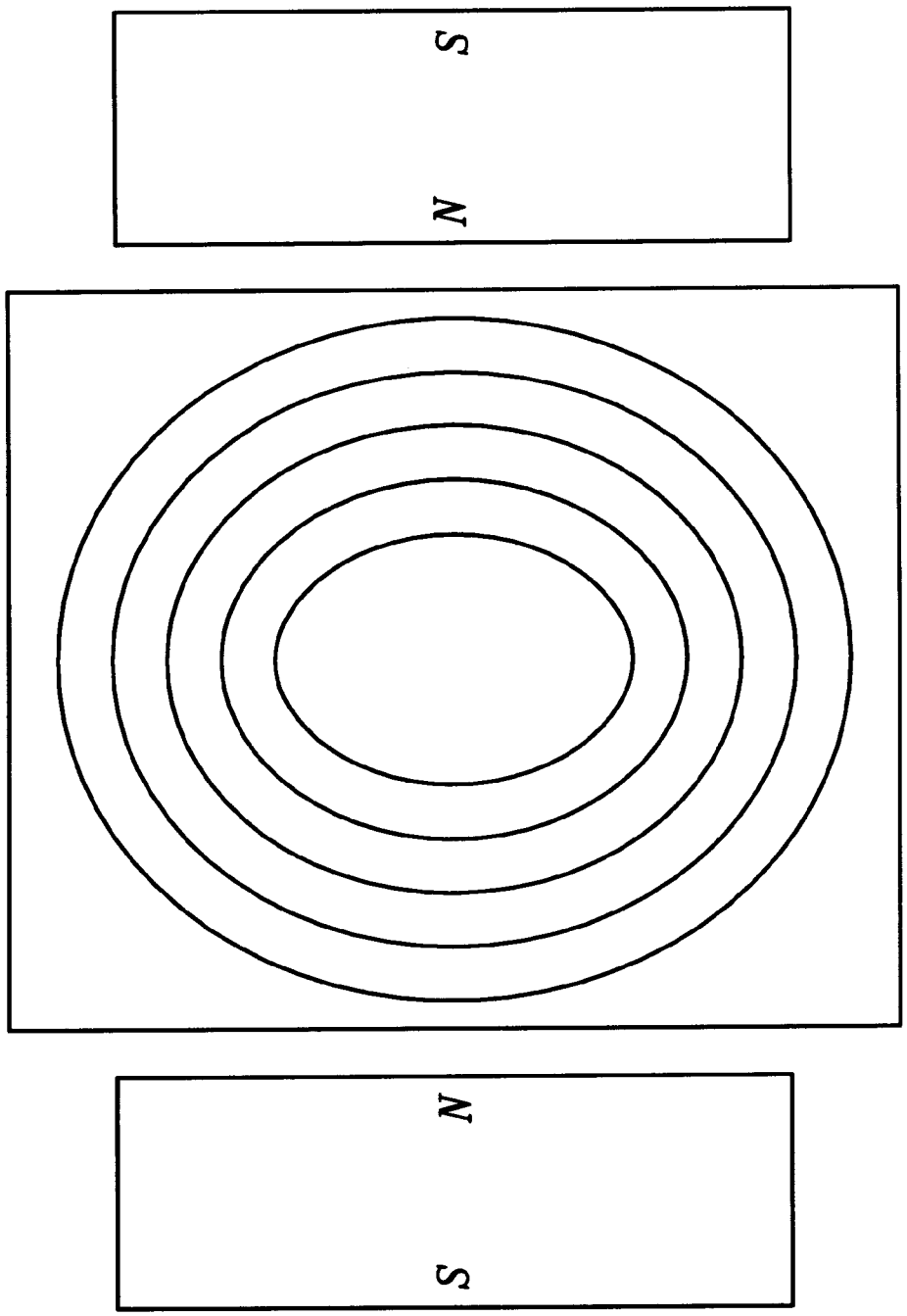
FIG. 1C is a diagram of magnetic field intensity corresponding to the system schematically illustrated in FIGS. 1A and 1B.

In the preferred embodiment, each magnet 18a and 18b is positioned externally to the container 10 and in contact with opposite walls 20 of the container 10. The two magnets 18a and 18b are oppositely polarized to establish a magnetic field gradient with the proper configuration. Each magnet 18a and 18b is positioned equidistant from the four corners of the wall 20 against which the magnet is positioned. If the north poles of the two magnets 18a and 18b face each other, the two magnets 18a and 18b create a quadrupole field with field lines 24 illustrated in FIG. 1B. If the south poles of the two magnets 18a and 18b face each other, the two magnets 18a and 18b create a quadrupole field with field lines like those illustrated in FIG. 1B, with the exception that the arrows point in the reverse direction. In either configuration, the opposing field vectors cancel each other in the central point 26 of the container 10, producing a net field strength of zero at the central point 26, indicated by an "x". The net field increases with distance from the central point as shown in FIG. 1C, where the concentric ovals represent lines of constant magnetic field intensity which increases with movement generally radially from the low-intensity zone at the center so that the central low intensity zone is surrounded by a zone of increased magnetic field intensity. If the object 12 is at the central point 26, it will be at low potential energy. The potential energy of the object 12 increases if it moves away from the central point 26. Thus, a restoring force causes the object 12 to move to or remain in the central point 26 of the container 10. To manipulate the object 12 rather than merely suspend the object, the magnets 18a and 18b may be moved.

In an actual embodiment, the container 10 is a 1" long, ½" in diameter, cylindrical glass vial. The object 12 suspended in the vial is a lysozyme crystal, one cubic millimeter in size. Two homogeneous ½" in diameter, ⅜" in thickness, circular permanent magnets 18a and 18b are used. The two magnets are positioned externally to the container and are oppositely polarized.

In another embodiment, two electromagnets, a left electromagnet 18a and a right electromagnet 18b, may be used in lieu of the two permanent magnets 18a and 18b. In an application which requires that the object 12 be manipulated back and forth laterally in the container, the electromagnets are positioned externally to the container 10 and on opposite sides of the container 10. If the surrounding medium 14 is more diamagnetic than the object 12, then to move the object from left to right, the right electromagnet 18b is turned on and the left electromagnet 86a is turned off. With the right electromagnet 18b on, the object 12 is effectively attracted to the right electromagnet 18b, because the right electromagnet 18b repels the surrounding medium 14 more strongly than it repels the less diamagnetic object 12. Similarly, to move the less diamagnetic object 12 from right to left, the left electromagnet 18a is turned on and the right electromagnet 16b is turned off. The object 12 is thereby effectively attracted to the left electromagnet 18a.

Figure 2A:
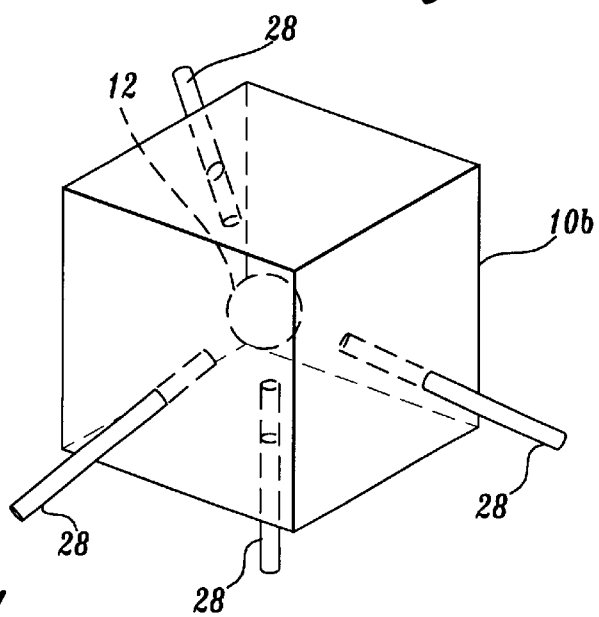
FIG. 2A is a schematic diagram of a system for moving or suspending an object in a container using positioner rods in a low gravity environment.

FIG. 2A shows another embodiment for suspension of the object 12 in a container 10b in which four positioner rods 28 are used in lieu of using only permanent magnets or only electromagnets. To suspend the object 12 in applications such as protein crystal growth and containerless materials processing, the positioner rods 28 are positioned in a tetragonal array about the center of the container 10b. The positioner rods 28 can be held in place by the container 10 or by a holding device such as a transparent outer shell (not shown), with threaded openings, enclosing the container 10. Adjustment of the positioner rods 28 by further inserting the positioner rods 28 into the container 10b or further drawing out the positioner rods from the container modifies the magnetic field gradient which controls the position of the object 12.

Figure 2B:
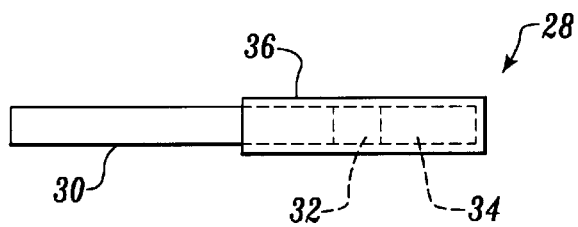
FIG. 2B is an enlarged schematic diagram of the positioner rod.

Referring to FIG. 2B, each positioner rod 28 consists of a non-magnetic support section 30 at one end, an electromagnet section 32, a permanent magnet section 34 at the other end, and a Teflon sheath 36 around the permanent magnet section and electromagnet section for protection. The permanent magnet 34 is preferably a strong magnet having a magnetic field strength of at least ¼ T. The permanent magnet section 34 generates a strong static magnetic field, while the electromagnet section 32 provides fine control over the total magnetic field generated by the positioner rod 28. Varying the current or voltage to the electromagnet section 32 causes the object to translate or rotate to correct for object drift or external forces affecting the object 12.

Control of the positioner rods 28 and fine-tuning of the electromagnet sections 32 are performed manually or are performed by a computer (not shown) using image processing. Using a video camera (not shown), a computer determines the spatial position of the object 12 and varies the current or voltage to the electromagnet section 34 of the appropriate position rod or rods 28 to change the magnetic field gradient, thereby controlling the movement of the object 12.

The present invention is further elaborated in the attached Jan. 6, 1997 article by B. Tillotson and J. Houston, titled "Diamagnetic Manipulation for Microgravity Processing" and published as AIAA 97-0887. This article is incorporated herein by reference.

While the preferred embodiment of the invention has been illustrated and described, it will be appreciated that various changes can be made therein without departing from the spirit and scope of the invention. For example, determination of the spatial location of the object can be accomplished by visual inspection or by the use of sensors. In addition, the electromagnet section 32 can be positioned around the permanent magnet section 34, rather than adjacent to the permanent magnet section 34. Furthermore, the object 12 may be solid, liquid, or a gas bubble surrounded by a liquid medium. Also, different types of magnets, such as flux-trapping superconducting magnets, can be used in lieu of conventional permanent magnets or electromagnets. Furthermore, the position of the magnets, the strength of the magnets, the number of magnets or positioner rods, the type and dimensions of container, and the surrounding medium can vary to accommodate different applications such as holding a crystal in the container while the surrounding medium is replaced, cell culturing, phase separation, liquid-liquid separation, particulate filtering and size sorting.

The embodiments of the invention in which an exclusive property or privilege is claimed are defined as follows:

1. A method for manipulating a diamagnetic object in a low gravity environment, which method comprises confining the object within a container, and inducing a magnetic field within the container which magnetic field has a central zone of a first magnetic field intensity surrounded by a zone of increased magnetic field intensity sufficient to maintain the diamagnetic object within the central zone.

2. The method of claim 1, including inducing the magnetic field by positioning a plurality of magnets adjacent to the container.

3. The method of claim 2, including inducing the magnetic field by positioning the plurality of magnets with like poles adjacent to the container and like poles remote from the container.

4. The method of claim 2, including adjusting the position of one or more of the magnets to alter the magnetic field and manipulate or maintain the position of the diamagnetic object within the container.

5. The method of claim 1, including maintaining the position of the object away from the walls of the container by using a plurality of magnets to create a magnetic field having a larger magnetic field gradient adjacent to the walls of the container than toward the center of the container.

6. The method defined in claim 1, including monitoring the position of the object within the container, and adjusting the magnetic field based on the position of the object.

7. The method defined in claim 6, including adjusting the magnetic field by adjusting the current or voltage supplied to electromagnets inducing the magnetic field in the container.

8. A method for manipulating an object in a surrounding medium in a low gravity environment wherein at least one of the object and the surrounding medium is diamagnetic and both the object and the surrounding medium are diamagnetic or non-magnetic, which method comprises confining the object within a container, and inducing a magnetic field within the container that interacts with the object and surrounding medium to create a first zone of a first magnetic field intensity surrounded by a second zone of greater magnetic field intensity sufficient to bias the object toward the first zone and position the object out of contact with the container.

9. The method defined in claim 8, including inducing the magnetic field within the container by positioning a plurality of magnets adjacent to the container.

10. The method of claim 9, including inducing the magnetic field by positioning the plurality of magnets with like poles adjacent to the container and like poles remote from the container.

11. The method defined in claim 9, including adjusting the position of one or more of the magnets relative to the container for adjusting the magnetic field within the container and thereby manipulate or maintain the position of the diamagnetic object within the container.

12. The method of claim 8, including maintaining the position of the object away from the walls of the container by using a plurality of magnets to create a magnetic field having a larger magnetic field gradient adjacent to the walls of the container than toward the center of the container.

13. The method defined in claim 8, including monitoring the position of the object within the container, and adjusting the magnetic field based on the position of the object.

14. The method defined in claim 13, including adjusting the magnetic field by adjusting the current or voltage supplied to electromagnets inducing the magnetic field in the container.

* * * * *